Nov. 24, 1970 R. DAHLBERG ET AL 3,543,102

COMPOSITE SEMICONDUCTOR DEVICE COMPOSED OF A PLURALITY OF SIMILAR ELEMENTS AND MEANS CONNECTING TOGETHER ONLY THOSE ELEMENTS HAVING SUBSTANTIALLY IDENTICAL ELECTRICAL CHARACTERISTICS

Filed March 30, 1964 4 Sheets-Sheet 1

Inventors:
Reinhard Dahlberg
Dieter Gerstner
Walter Klossika

By: Spencer & Kaye
ATTORNEYS

Nov. 24, 1970 R. DAHLBERG ET AL 3,543,102

COMPOSITE SEMICONDUCTOR DEVICE COMPOSED OF A PLURALITY OF SIMILAR ELEMENTS AND MEANS CONNECTING TOGETHER ONLY THOSE ELEMENTS HAVING SUBSTANTIALLY IDENTICAL ELECTRICAL CHARACTERISTICS

Filed March 30, 1964 4 Sheets-Sheet 2

Inventors:
Reinhard Dahlberg
Dieter Gerstner
Walter Klossika
By: Spencer & Kaye
ATTORNEYS Nov. 24, 1970 R. DAHLBERG ET AL 3,543,102

COMPOSITE SEMICONDUCTOR DEVICE COMPOSED OF A PLURALITY OF SIMILAR ELEMENTS AND MEANS CONNECTING TOGETHER ONLY THOSE ELEMENTS HAVING SUBSTANTIALLY IDENTICAL ELECTRICAL CHARACTERISTICS

Filed March 30, 1964 4 Sheets-Sheet 3

INVENTORS.

Reinhard Dahlberg
Dieter Gerstner
Walter Klossika

BY Spencer & Kaye

ATTORNEYS.

Nov. 24, 1970 R. DAHLBERG ET AL 3,543,102

COMPOSITE SEMICONDUCTOR DEVICE COMPOSED OF A PLURALITY OF SIMILAR ELEMENTS AND MEANS CONNECTING TOGETHER ONLY THOSE ELEMENTS HAVING SUBSTANTIALLY IDENTICAL ELECTRICAL CHARACTERISTICS

Filed March 30, 1964 4 Sheets-Sheet 4

INVENTORS.
Reinhard Dahlberg
Dieter Gerstner
Walter Klossika

BY Spencer & Kaye
ATTORNEYS.

United States Patent Office 3,543,102

Patented Nov. 24, 1970

3,543,102

COMPOSITE SEMICONDUCTOR DEVICE COMPOSED OF A PLURALITY OF SIMILAR ELEMENTS AND MEANS CONNECTING TOGETHER ONLY THOSE ELEMENTS HAVING SUBSTANTIALLY IDENTICAL ELECTRICAL CHARACTERISTICS

Reinhard Dahlberg, Dieter Gerstner, and Walter Klossika, Heilbronn (Neckar), Germany, assignors to Telefunken Patentverwertungs GmbH., Ulm (Danube), Germany Filed Mar. 30, 1964, Ser. No. 355,694

Claims priority, application Germany, Apr. 5, 1963, T 23,794

Int. Cl. H01l 19/00

U.S. Cl. 317—101 2 Claims

ABSTRACT OF THE DISCLOSURE

The present invention relates generally to the semiconductor art, and more particularly, to a semiconductor arrangement which includes several semiconductor elements and especially transistors and/or diodes which are connected together and built up on a common semiconductor body. The invention also relates to a method for producing such an arrangement.

The semiconductor elements of such an arrangement are thermally coupled because they have a common semiconductor body. However, by this thermal coupling no sufficient increase in power handling capability is obtained.

The invention is based on the knowledge that an increase of the power handling capability is only obtained if the entire electrical power loss is distributed among the individual elements as uniformly as possible.

With these problems of the art in mind, it is a main object of the present invention to provide a semiconductor arrangement wherein several semiconductor elements are connected together and built up on a common semiconductor body and wherein their power handling capability is increased.

Another object of the invention is to provide a device of the character described wherein the entire electrical power loss is distributed among the individual elements as uniformly as possible.

Still a further object of the invention is to provide an arrangement wherein the maximum power handling capability in the form of heat dissipation is increased substantially.

These objects and others ancillary thereto are accomplished in accordance with preferred embodiments of the present invention wherein the uniform distribution of the electrical power loss or load is accomplished by only connecting those individual elements of the common semiconductor body which are substantially identical with one another insofar as their electrical characteristics are concerned.

The connecting of those individual elements which are substantially identical with one another insofar as their electrical characteristics are concerned is accomplished by determining those elements the electrical characteristics of which are not within a certain tolerance level. These elements are not connected.

A further improvement is obtained by using a system of electric conductor film leads providing conductor film leads for all the individual elements. In this case all unusable elements are covered with an electrically isolating layer for neutralizing these elements. This connecting technique has the advantage that by covering the unusable elements with an insulating layer, short-circuits by electric conductor film leads leading to unusable elements are avoided. By use of the evaporating technique the same evaporating mask may be used for all semiconductor arrangements independent of the particular manufacturing distribution of the individual semiconductor elements if, by the evaporating mask used, electric conductor film leads are obtained for the usable and the unusable elements.

As an isolating layer, for instance, organic thermoplasts, glass coatings or lacquer layers are used. The electric conductor film leads, for example, can consist of aluminium or a combination of nickel or chromium with aluminium, silver, copper or gold.

The uniform distribution of the electrical power loss or load will also be improved by increasing the thermal coupling of the individual elements. The increasing of the thermal coupling is accomplished by soldering the semiconductor body on a common plate. A further improvement is obtained by a substantial electrical decoupling of the individual elements from one another.

The electrical decoupling of the elements can be accomplished, for example, by connecting resistors in the electrode leads. In using transistors, these resistors are preferably connected to the emitter lead. Capacitors may be connected in parallel with these resistors in order to improve the high frequency characteristics.

In a further feature of the invention, the electrode leads are, at the same time, constructed as electric fuses and the uniform distribution of the load is also maintained at the time an element fails to operate.

Additional objects and advantages of the present invention will become apparent upon consideration of the following description when taken in conjunction with the accompanying drawings in which.

Figure 1:
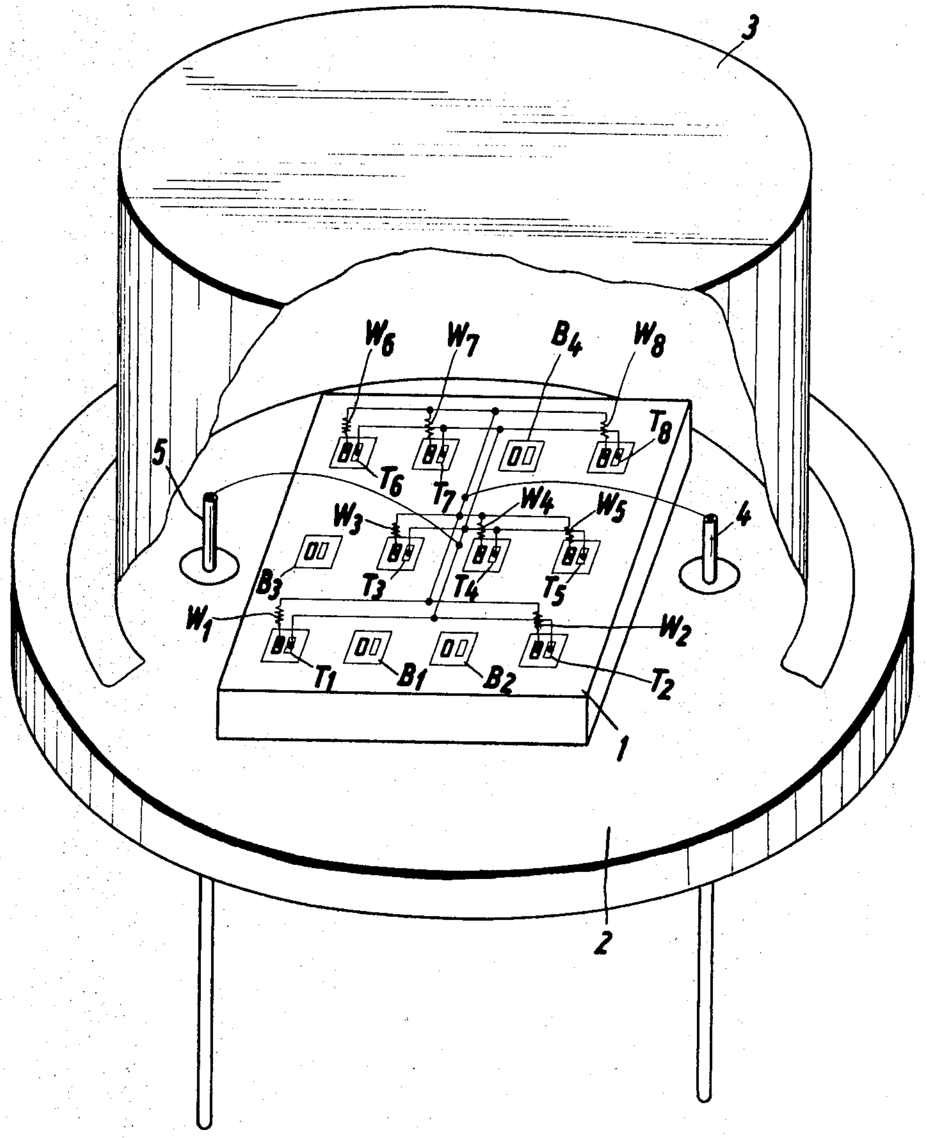
FIG. 1 is a perspective diagrammatic view through one embodiment of the present invention.

With more particular reference to the drawings, FIG. 1 illustrates an arrangement consisting of twelve individual planar transistors with a common semiconductor body 1. However, only eight transistors ($T_1 \ldots T_8$) of these twelve individual elements are connected together. The remaining four systems $B_1 \ldots B_4$ are not connected because their electric values differ too much from the values of the transistors $T_1 \ldots T_8$.

The thermal coupling necessary for a uniform distribution of the electrical power loss or load among the individual elements is accomplished by soldering the common semiconductor plate 1 onto the heat conducting socket 2, which is a good conductor of heat, of the casing consisting of the socket and the cover 3. The uniform distribution of load is further improved by the decoupling resistors $W_1 \ldots W_8$ connected to the emitter leads.

All the emitter leads are connected in parallel with one another and they have a common emitter lead 4. In the same manner the base leads also connected in parallel with one another have a common base lead 5. The collector zones of the transistors, however, are contacted by soldering the semiconductor body onto the socket.

Figure 3:
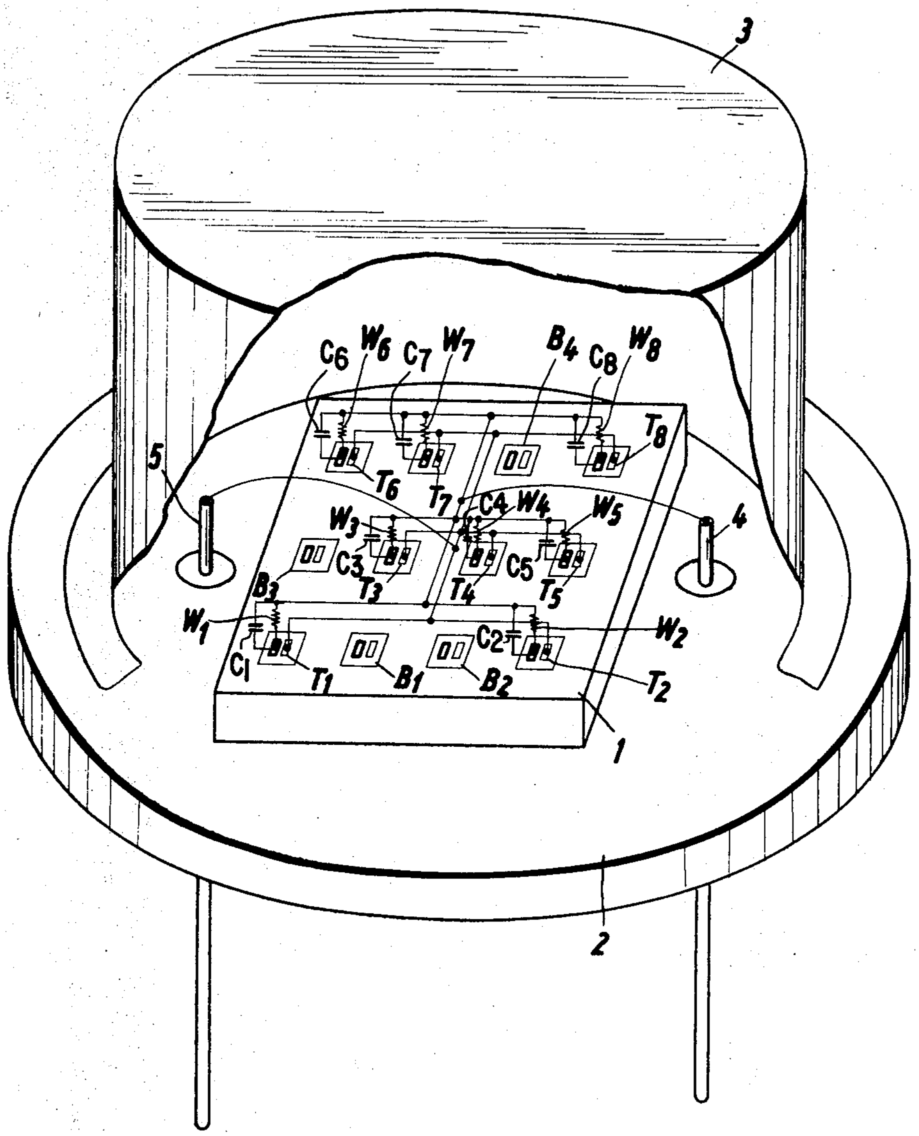
FIG. 3 is a view similar to that of FIG. 1 of a modified form of construction of the arrangement of FIG. 1.
Figure 5:
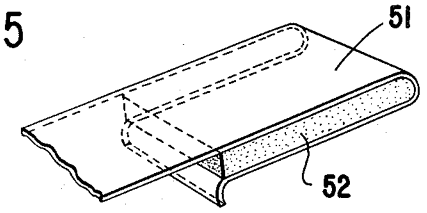
FIG. 5 is a perspective detail view of a portion of an electrode lead which may be employed in the embodiment of FIG. 3.

As may be seen in FIG. 3, capacitors $C_1$–$C_8$ may be connected in parallel with the decoupling resistors $W_1 \ldots W_8$ in order to improve the high frequency characteristics. The electrode leads can be made strip-like and folded to form a double strip, as is shown in FIG. 5 wherein the end 51 of a strip-like electrode lead is folded over to form such a double strip. In this case preferably a dielectric material layer 52 is provided between the two portions of end 51 and this may, for example, be mica. Because of these arrangements, these leads have the property of the decoupling resistors because if a dielectric material is positioned between the strip-like portions of these electrode leads, the electrode leads not only have an ohmic but also a capacitive effect. Such electrode leads can always be used in place of electrode leads with ohmic and capacitive resistors connected in parallel. The electrical leads can be also, at the same time, constructed as electric fuses, for example by making the lead shown in FIG. 5 of a material having a suitably low melting point.

Figure 2:
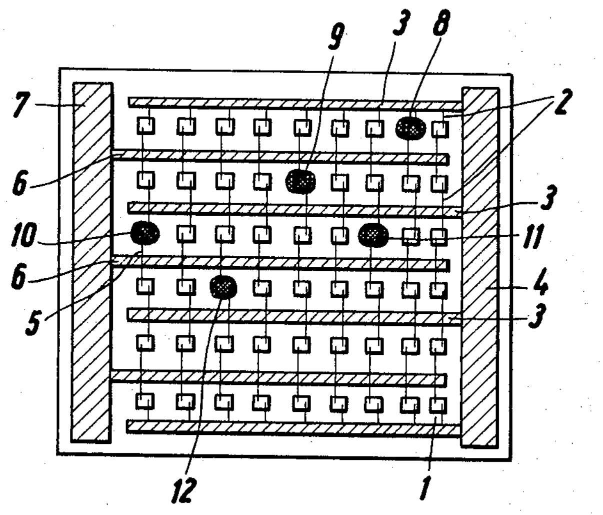
FIG. 2 is a plan view of another embodiment of the invention.
Figure 4:
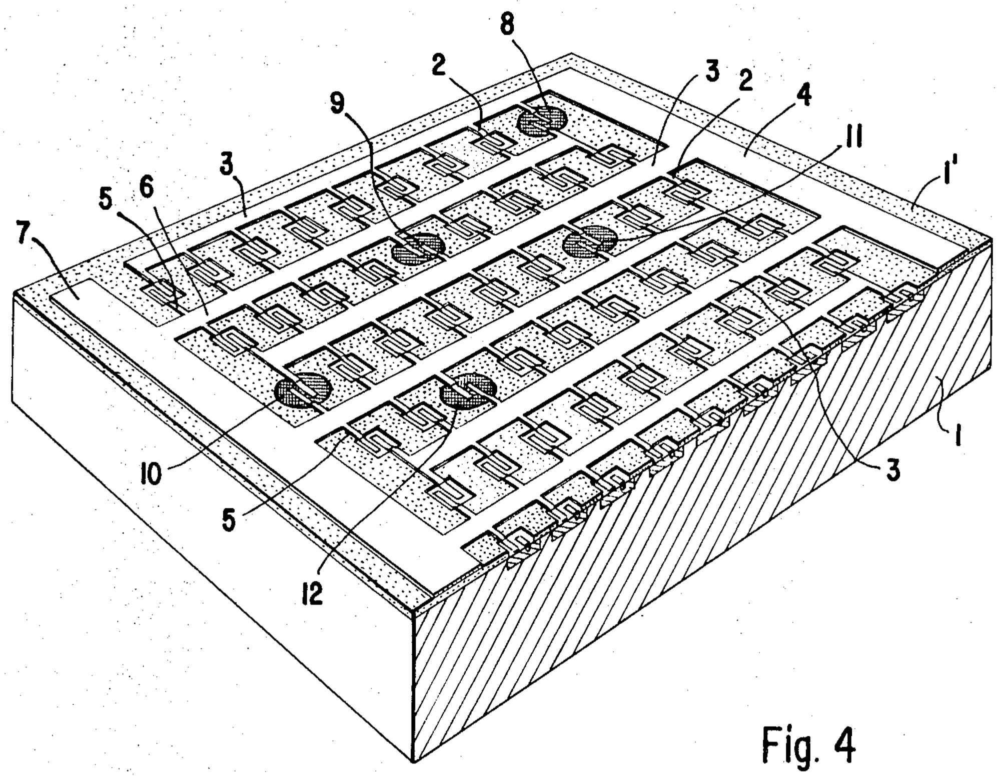
FIG. 4 is a perspective view of the arrangement of FIG. 2.

With more particular reference to FIG. 2, a high frequency power transistor is illustrated which includes a number of individual elements which are connected together and built up on a common slice 1 of silicon. The individual elements are silicon planar transistors. The acceptable ones of these elements are connected in parallel. The emitter electrodes are connected in parallel by the conducting films 2 each of which connects two emitter electrodes of two neighboring transistors so that they are electrically connected together. These conducting films are again connected electrically by the conducting films 3. These conducting films 3 on their part are connected electrically with the emitter electrode 4. Each single conducting film is not located directly on the silicon surface but, as is shown in FIG. 4, on the oxide layer 1' or a special insulating layer associated with planar transistors. Such an insulating layer is also necessary for nonplanar systems. The deposition of an insulating layer used as sublayer for the conducting films is applied by a thermal decomposition, by applying a glass layer by a melting process, or by evaporation in vacuum. The structure of the conducting films on the surface of the wafer, for example, can also be produced by evaporating a coherent metal film from which the conducting film structure is formed by etching.

The conduction in parallel of the base electrodes is accomplished in the same manner by the conducting films 5 and 6. The conducting films 6 form both the connection of the conducting films 5 and the connection with the common base electrode 7.

The elements 8, 9, 10, 11 and 12 were found to be unusable. Therefore, they are covered with an electrically insulating layer consisting, for example, of glass, an organic thermoplast or laquer applied before the conducting films are evaporated. If the conducting films are evaporated by a mask providing conducting films for all the elements and, therefore, also for rejects, then the conducting films leading to the rejects end up on the insulating layer. In this case the insulating layer avoids shorting or other electrically malfunctions.

The conducting films, for instance can be made of aluminium or a combination of nickel, or chromium with aluminium, silver, copper or gold.

It will be understood that the above description of the present invention is susceptible to various modifications, changes and adaptations, and the same are intended to be comprehended within the meaning and range of equivalents of the appended claims.

What is claimed is:

1. A semiconductor arrangement comprising in combination:

a common semiconductor body;

a plurality of individual semiconductor elements; and means connecting only those of said individual elements on said semiconductor body which are substantially identical with one another insofar as their electrical characteristics are concerned, said means including electrodes associated with said semiconductor elements and having leads connected thereto which are in the form of strips arranged so that they are effective electrically as decoupling resistances, these strip electrode leads being folded to form a double strip with a dielectric material being disposed between the layers of said double strip.

2. An arrangement as defined in claim 1 wherein said dielectric material is mica.

References Cited

UNITED STATES PATENTS

| | | | |
|---|---|---|---|
| 2,721,822 | 10/1955 | Pritkin. | |
| 3,317,653 | 5/1967 | Layer et al. | 174—68.5 |
| 2,655,625 | 10/1953 | Burton | 317—101 |
| 2,924,760 | 2/1960 | Herlet | 317—235 |
| 3,137,796 | 6/1964 | Luscher | 317—234 |
| 3,219,748 | 11/1965 | Miller | 317—235 |
| 2,994,834 | 8/1961 | Jones | 317—101 |
| 3,029,366 | 4/1962 | Lehovec | 317—101 |

ROBERT S. MACON, Primary Examiner

D. SMITH, Jr., Assistant Examiner

U.S. Cl. X.R.

29—574, 576; 317—234